United States Patent
Wojnarowski et al.

[11] Patent Number: 5,225,023
[45] Date of Patent: Jul. 6, 1993

[54] HIGH DENSITY INTERCONNECT THERMOPLASTIC DIE ATTACH MATERIAL AND SOLVENT DIE ATTACH PROCESSING

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 745,982

[22] Filed: Aug. 5, 1991

Related U.S. Application Data

[63] Continuation of Ser. No. 312,798, Feb. 21, 1989, abandoned.

[51] Int. Cl.$^5$ .............................................. B32B 31/00
[52] U.S. Cl. ............................. 156/298; 156/83; 156/155; 156/182; 156/281; 156/305; 156/309.3; 156/324.4; 156/344; 437/209; 437/211
[58] Field of Search ............... 156/324.4, 309.3, 330.9, 156/155, 298, 182, 344, 280, 83, 305, 281; 437/209, 211; 524/384

[56] References Cited

U.S. PATENT DOCUMENTS

| | | | |
|---|---|---|---|
| 3,600,246 | 8/1971 | Breen | 156/309.3 |
| 3,649,418 | 3/1972 | James | 156/308.6 |
| 3,681,139 | 8/1972 | Jannett et al. | 156/344 |
| 4,652,398 | 3/1987 | Goswami et al. | |
| 4,783,695 | 11/1988 | Eichelberger et al. | 357/65 |

FOREIGN PATENT DOCUMENTS 0051165  5/1982  European Pat. Off. .
0110285  6/1984  European Pat. Off. .

OTHER PUBLICATIONS

L. Ying, "A Novel Approach—Thermoplastic Die Attach Adhesive", IEEE 36th Electronic Components Conference, Seattle, Wash. May 5-7, 1986, pp. 285-295.

*Primary Examiner*—John J. Gallagher
*Attorney, Agent, or Firm*—Marvin Snyder

[57] ABSTRACT

A mixture for affixing dice to a substrate includes a thermoplastic polyimide, a solvent for the polyimide, and a solvent which does not dissolve the polyimide but adds thixotropicity to the mixture. The mixture is applied to the substrate, the dice are placed thereon, and the solvents are evaporated to bond the dice to the substrate. The bond is radiation hard and exhibits high shear pull strength. A poor solvent for the polyimide, sprayed over the dice and exposed portions of die attach material, causes some polyimide to precipitate out of solution in the exposed portions of die attach material to form a grid that extends between the dice and prevents the dice from "swimming together" during high temperature processing. In a solvent die-attachment method, the substrate is first coated with a mixture of die attach material, and the mixture is dried. Spraying a solvent over the die attach material causes the material to soften so that the dice applied thereto may adhere. The die attach material is then dried to form the bond.

30 Claims, 1 Drawing Sheet

HIGH DENSITY INTERCONNECT THERMOPLASTIC DIE ATTACH MATERIAL AND SOLVENT DIE ATTACH PROCESSING

This application is a continuation of application Ser. No. 07/312,798, filed Feb. 21, 1989, now abandoned.

CROSS-REFERENCE TO RELATED APPLICATIONS

This application is related to the following copending applications which are assigned to the instant assignee and are incorporated herein by reference:

"An Adaptive Lithography System to Provide High Density Interconnect", Ser. No. 947,461, filed Dec. 29, 1986, now U.S. Pat. No. 4,835,704, issued May 30, 1989;

"Integrated Circuit Packaging Configuration for Rapid Customized Design and Unique Test Capability", Ser. No. 912,457, filed Sep. 26, 1986, now U.S. Pat. No. 4,783,695, issued Nov. 8, 1988;

"Method and Apparatus for Packaging Integrated Circuit Chips Employing a Polymer Film Overlay Layer", Ser. No. 240,367, filed Aug. 30, 1988 now U.S. Pat. No. 4,933,042, issued Jun. 12, 1990, continuation of Ser. No. 912,458, filed Sep. 26, 1986, now abandoned;

"Integrated Circuit Test Structure and Test Process", Ser. No. 305,314, filed Feb. 3, 1989, now abandoned in favor of continuation application Ser. No. 07/559,532, filed Jul. 19, 1990;

"Simplified Method for Repair of High Density Interconnect", Ser. No. 283,095, filed Dec. 12, 1988, now U.S. Pat. No. 4,878,991, issued Nov. 7, 1989; and "Method and Apparatus for Removing Components Bonded to a Substrate", Ser. No. 249,927, filed Sep. 27, 1988.

BACKGROUND OF THE INVENTION

1. Field of the Invention

This invention relates to a die attach material that has significant shear strength and high tolerance to ionizing radiation, and a method for using such material to maintain the relative positions of a plurality of dice during high temperature processing and to attach the dice to a substrate by interjecting a solvent to a dried layer of die attach material situated between a die and the substrate.

2. Description of the Prior Art

Thermoplastic materials pass through a specific sequence of property changes as their temperature changes. In particular, as temperature increases, a thermoplastic material will change from a glass to a flexible substance, and then to a liquid. Conversely, as temperature decreases, the property changes will occur in reverse order. The property changes occur at transition temperatures which are specific to the thermoplastic compound.

Thermosetting materials exist initially in the liquid state but, on heating, undergo a reaction to form a solid exhibiting a highly crosslinked molecular matrix. Unlike thermoplastics, the heat reaction of thermosetting materials is not reversible.

Thixotropy is a property of certain colloidal gels, meaning that they are coagulated when at rest but become fluid when agitated or otherwise subjected to stress.

Use of polymeric materials, glue or so-called "die attach" materials to bond an integrated circuit chip or die to a substrate has long been known in the art. Most currently-available die attach materials are epoxy resins, also known as epoxies. Epoxy resins function as thermosetting compounds and are permanently hard once cured. Filler materials can be mixed with an epoxy resin to gain thixotropic attributes. Epoxies can only be slightly softened to allow for die removal and the softening point varies considerably between materials. Epo-Tech resin sold by Epoxy Technology, Inc. of Billerica, Mass. and Able Stick resin sold by the Able Stick Company of Gardenia, Calif. are two examples of epoxy-based die attach materials.

Thermosetting polyimide materials have also been used as die attach materials. Like the epoxies, thermosetting polyimide materials prevent the die from being easily removed from a substrate since the thermosetting bonding material does not soften significantly on heating. Heating to very high temperatures is required to achieve only a slight amount of softening. Moreover, thermosetting polyimides cure by a condensation reaction in which water is produced during the reaction and must be evaporated. This poses a formidable obstacle to bonding multiple chips in a large area or to bonding a single very large scale integrated circuit (VLSI) chip since boiling off the water causes the chips to shift positions, and nonuniformity of bonding has been attributed to such evaporation. Furthermore, not only are temperatures in excess of 250° C. required for some imidization reactions to proceed, but also, thermosetting polyimide resins must be refrigerated in order to be useful. With some thermosetting polyimide resins, B-staging has been observed in less than one week at room temperature. G. E. Silicones of Waterford, N.Y., E. I. du Pont de Nemours and Co. of Wilmington, Del., and M & T Chemicals of Rahway, N.J. are commercial vendors of thermosetting polyimides.

Some thermoplastic materials have been used as die attach materials. Thermoplastic materials are typically available in pellet or film form. The pellets may be solvented by appropriate solutions. Fully-reacted thermoplastic materials which are in solvented form merely need a drying cycle to yield a bond. Drying occurs at relatively low temperatures compared to the high temperatures required for imidization. M & T Chemicals markets a polyimide siloxane material designated 2064 which is used for bonding chips to substrates; however, it is not thixotropic, it softens at a temperature below 100°C. and it readily dissolves in a number of solutions. Therefore, 2064 material has limited utility in chip packaging procedures which require exposing the chips to heat and solvents during processing, since the chips may become weakly attached or be totally lifted during these procedures. Thermoplastic materials which have limited solubility usually must be solvented with n-methylpyrrolidone (NMP). Being extremely hygroscopic, however, NMP imposes a severe limitation on employing a polymer material for die attachment since water molecules in the air are collected by the polymer blend and cause the polymer material to separate out of solution. This separation is usually observable as a white skin that forms over the surface of the polymer blend. The skin tends to keep the polymer blend from wetting the chip and substrate, thereby preventing die attachment.

Many available die attach materials are not tolerant to ionizing radiation, i.e., not radiation hardened, and are, therefore, unacceptable for use in an ionizing radiation environment. Some die attach material fillers may exhibit spalling, resulting in die detachment, when exposed to a dose of high ionizing radiation. Some die attach materials have been found to undergo outgassing in high ionizing radiation environments, which can also result in die detachment.

When joining a plurality of closely spaced dice to a substrate, the normal, large, auto-dispersed dots of glue which are typically used for die attachment tend to ooze out beyond the edges of the chips. The dot masses join together and, by capillary action, draw the chips together. Numerous attempts have been made to correct this so-called "swimming together" problem by using precision displacement dispensers to deposit a precise array of dots to minimize glue spread when die attachment takes place. Commercially available pick-and-place machines, however, tend to require too much time for dispensing the dots in a precise manner. At a dispensing time of 2 seconds per dot, where the diameter of each dot measures approximately 5-10 mils, then for a 4×4 inch substrate filled with dice, 10 to 16 minutes can pass before all the dice are attached. Although stamps have been conceived to shorten the glue dot placement time, they have not consistently produced good results.

Epoxy materials which harden with heat have not proven to be satisfactory die attach materials for closely-spaced dice for two reasons: first, the viscosity of epoxy materials drops drastically during cure, thus allowing the dice to swim together and, second, epoxy materials which are time-cured have a tendency to rise to different levels above the substrate surface while curing during the placement of dice on the dots, thus causing variability in chip height and bonding. Pre-imidized polymer materials such as polyetherimides and polyimide siloxanes are available in solution and require the solvent to dry out in order to form a bond. Hygroscopic solvents such as NMP are typically used with these pre-imidized polymer materials and, in humid environments, tend to skin over, as discussed above, on the order of seconds. Such pre-imidized polymer materials would therefore be unsatisfactory for bonding a plurality of dice in a span of 16 minutes. Attempts have been made to obviate the hygroscopicity problem by using di-glime as the solvent, a mixture of dimethyl ethers instead of NMP; however, di-glime is faster drying than NMP and may evaporate from solution before all the dice have been placed on the glue dots. In addition, evaporation of di-glime may make the polyimide blend unstable and thereby limit its wetting ability. Thermosetting polyimide materials, which must be fully imidized to hold dice, undergo imidization at high temperatures and, because the reaction is by condensation, severe out-gassing occurs which can result in die-detachment. Moreover, thermosetting resins cannot be softened after they have been fully cured, making repair of a die difficult if not impossible.

SUMMARY OF THE INVENTION

One object of this invention is to provide a die attach material that is highly resistant to ionizing radiation and capable of being softened numerous times for die attach, die removal and repair.

Another object is to provide, for holding dice in place on a substrate, a nonhygroscopic, nonoutgassing, thixotropic polyimide mixture comprising a plurality of solvents mixed with a polyimide and which avoids precipitation as some of the solvents evaporate.

Another object is provide a die attach material that does not appreciably soften at temperatures up to 125°C. and is not readily soluble in commonly available solvents used for die cleaning.

Another object is to provide a die attach material that is stable at room temperature and can be exposed to ambient air for a long period of time without impairing its wetting ability.

Another object is to provide a die attach material having greater than 30 pounds shear strength.

Another object is to provide a method for using a die attach material disposed on a substrate to create a solid grid structure for maintaining separation of a plurality of closely-spaced dice from one another during attachment of the dice to the substrate.

Another object is to provide a method for attaching dice to a substrate which requires application of only a solvent to a partially-dried or fully-dried thermoplastic die attach material just prior to attachment.

Another object is to provide a method of attaching dice to a substrate wherein a mixture of poor solvents is used to refresh pre-dried layers of a polymer on each of the dice and substrate.

Briefly, in accordance with a preferred embodiment of the invention, die attach mixtures of a highly thixotropic nature are prepared using a polyetherimide resin that is sold as Ultem ® 6000 by G. E. Silicones. One such mixture comprises orthodichlorobenzene (ODCB), meta-cresol, and Ultem 6000 polyetherimide and another such mixture comprises acetophenone, meta-cresol, and Ultem 6000 polyetherimide. Meta-cresol is one of the few known solvents for Ultem 6000 polyetherimide. Other cresols may be used, depending on the boiling point one desires. The mixtures are heated to 100°C. and rolled on a two-roll mill until the Ultem 6000 polyetherimide is fully in solution. The mixtures are gel-like and have been found to overcome the disadvantages of die attach materials of the prior art.

It has been found that a die will tend to move slightly during the attachment process, even with the best die attach mixtures. Movement may be caused by the viscosity of the die attach material decreasing as the processing temperature increases or by the increased solvency of Ultem 6000 polyetherimide in hotter solvents. Upon curing, the ODCB or acetophenone evaporates slightly before the meta-cresol. After ODCB or acetophenone evaporation, the meta-cresol causes the die attach material to develop a runny consistency which permits a slight amount of chip movement. One method for preventing chip movement requires using a minimum quantity of meta-cresol so that the die attach mixture remains extremely viscous and holds the die in place during the attachment process. One drawback to using a meta-cresol limiting approach is that ideal cure procedures must be developed for each die type to prevent die movement. Such approach, moreover, is not always perfect with a large die since the plastic path of the die is lengthy from the center of the die to its edge.

The invention contemplates employing a post die attach processing step wherein a grid is created from the exposed die attach material between the chips to prevent the chips from moving together. One method for creating the grid involves spraying a poor solvent for the die attach material over the chips, allowing the exposed die attach material between the chips to absorb the solvent and cause some of the dissolved polymer to precipitate. Another method for creating the grid, depending on the composition of the die attach material, employs a partial ultraviolet (UV) cure of the exposed die attach material. The objective of the grid is to keep the chips separated during die attach processing at lower temperatures. The grid does not redissolve or reliquefy until the final drying steps, which are performed at relatively high temperatures.

According to the invention, the die attach procedure can be greatly improved by using a solvent system to redissolve or "refresh" partially-dried or fully-dried die attach material. Although plastic parts have previously been joined together using a solvent refresher, such technique has not heretofore been applied in bonding a nonplastic material, such as silicon, to a nonplastic substrate, such as alumina, by refreshing a polymer layer on the die and/or substrate with a solvent to permit such bonding. In this invention, a solvent for a die attach material is applied to a substrate and/or die having a layer of dried die attach material thereon. The dried die attach material may be either partially dried or fully dried. The solvent causes the die attach material to soften, at which time the die is joined to the substrate. The die attach material is then dried, creating a bond of sufficient strength to exceed the requirements of current military specifications.

The solvent die attach process is readily adaptable to use in automated die-placing machines. The solvent, or a low solids blend of die attach material and solvent, is applied to the substrate just before the die is placed by the die-placing machine. The type and quantity of solvent are chosen to yield the desired open use time for the die attach material. The open use time is the amount of time that may elapse before the die attach mixture loses its ability to wet a chip and affix it to a substrate.

BRIEF DESCRIPTION OF THE DRAWINGS

The foregoing and other objects, aspects and advantages of the invention will be better understood from the following detailed description of the invention with reference to the drawings, in which.

DETAILED DESCRIPTION OF THE PREFERRED EMBODIMENTS OF THE INVENTION

Figure 1:
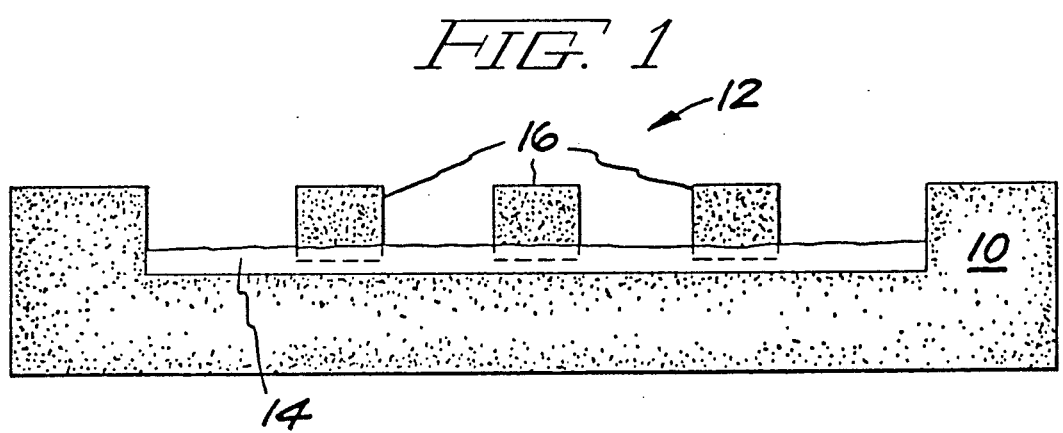
FIG. 1 is a cross-sectional side view of an alumina substrate with a thixotropic die attach mixture situated in a cavity and a plurality of dice placed on the die attach mixture.

Mixtures have been prepared that are useful as die attach materials. Table 1 identifies the die attach mixture compositions which have been found to be most useful.

TABLE 1

| DIE ATTACH MIXTURES | | |
|---|---|---|
| | | Wt. % |
| (1) | 80 gms. Ultem 6000 polyetherimide pellets | 20 |
| | 64 gms. meta-cresol | 16 |
| | 256 gms. orthodichlorobenzene (ODCB) | 64 |
| (2) | 80 gms. Ultem 6000 polyetherimide pellets | 20 |
| | 64 gms. meta-cresol | 16 |
| | 256 gms. acetophenone | 64 |

Ultem 6000 polyetherimide is a polymer formed by the condensation of (BPADA) and pyromellitic dianhydride (PMDA) with metaphenylene diamine (MPDA). The weight percentages listed in Table 1 have been found to be the most desirable for use as a die attach mixture; however, any of the components can be varied by as much as 2:1, e.g., Ultem 6000 polyetherimide ranging from 11% to 33%, meta-cresol ranging from 9% to 28%, and ODCB or acetophenone ranging from 47% to 78%. In addition, Ultem ® 1000 resin, also available from G. E. Silicones, may be substituted for Ultem 6000 polyetherimide. Ultem 1000 resin is a polymer formed by the condensation of (BPADA) with MPDA and is not as hard as Ultem 6000 polyetherimide because it lacks the PMDA component. Ultem 6000 polyetherimide is preferred for use in a die attach material because it begins to flow at a higher temperature than Ultem 1000 resin.

The mixtures are heated to 100°C. and rolled on a two-roll mill until the Ultem polyetherimide is in solution, at which juncture the mixtures are gel-like and not hygroscopic. Meta-cresol is one of the few available solvents for both Ultem 6000 polyetherimide and Ultem 1000 resin. Other cresols may be substituted for meta-cresol, although para-cresol is very hazardous. Acting alone, neither ODCB nor acetophenone can dissolve Ultem polyetherimide 6000 or Ultem 1000 resin. Only a small amount of meta-cresol is required to start softening Ultem 6000 polyetherimide or Ultem 1000 resin, at which time the ODCB or acetophenone is enabled to bring the respective mixture into solution. Variations in the meta-cresol content have the greatest effect on the degree of thixotropicity of the die attach mixtures, which are formed.

Both mixtures (1) and (2) are highly thixotropic and are able to retain dice in place once set. ODCB evaporates from mixture (1) before meta-cresol evaporates. Likewise, acetophenone evaporates from mixture (2) before meta-cresol evaporates. The following drying cycle has been used to dry the mixtures: 10 minutes at 100°C., 20 minutes at 150°C., and 20 minutes at 300 C. The drying times and cycles vary, depending on the die size or area to be joined, with larger areas requiring longer amounts of time to ensure that all the solvent has evaporated. Mixture (1) has been found to have a 15 minute open use time while mixture (2) has a 1 hour open use time. Both mixtures have sufficiently long open use times for industrial uses since commercial die-placing machines have been found to take approximately 10 minutes to place 50 dice on a substrate. These open use times are significantly better than for other systems in which a polyimide is dissolved in NMP, due to the hygroscopicity of NMP which quickly results in formation of a skin over the surface of the polyimide blend, preventing the wetting required to attach a die. A variety of applicators have been used with die attach mixtures including toothpicks, probes, droppers, and automated placing collets.

For some applications, a conductive die attach material is required. Inclusion of silver flakes in the die attach mixture results in good electrical conductivity. For example, modifying mixture (1) by adding 125 grams of silver flakes yields a contact resistance of less than 0.012 ohms. It is preferable to use silver flakes in a 1 to 10 micron diameter size, such as are available from Alpha Metals of Danvers, Mass. The amount of silver flakes in the die attach material can vary from 25 to 60 weight percent without seriously affecting die attachment capability.

After the mixtures have been fully dried, Ultem 6000 polyetherimide remains to bond the die to a substrate.

The dried mixture has greater than 30 pounds shear strength, greatly exceeding current military specifications. The bond is radiation hardened and has been found to withstand greater than $10^{9.5}$ rad/sec. silicon. Since Ultem 6000 polyetherimide is thermoplastic, it allows for easy removal of dice for repairing circuits. The dice may be removed from the substrate by heating the die attach material to a temperature at which it begins to flow, thus allowing each defective die to be readily pulled from the substrate. The Ultem 6000 polyetherimide transition temperature is approximately 236°C., although the material does not begin to flow sufficiently until 300°C. is reached, which is a high enough temperature to allow the chips to remain attached during other processing steps. For example, high density interconnect (HDI) circuits of the type described in one or more of the above-referenced co-pending applications have a polymer overlay layer laminated over the tops of a plurality of chips and may use Ultem 1000 resin as an adhesive for lamination. Ultem 1000 resin melts at approximately 217°C., and therefore the Ultem 6000 thermoplastic die attach material will keep the chip securely bonded to the substrate during such lamination operation, due to its much greater viscosity at this temperature. Alternatively, meta-cresol, NMP, or other suitable solvent can be sprayed on the die attach material to soften it so as to allow removal of the dice from the substrate. Solvents typically used to remove the top adhesive in HDI circuitry do not affect the thermoplastic die attach material.

FIG. 1 shows a substrate 10 which may comprise alumina, silicon, or any other suitable material. The substrate may have a cavity 12 for receiving a plurality of die 16. Cavity 12 contains a die attach material 14 which serves to bond dice 16 to substrate 10. The bottom of each die 16 is immersed in die attach material 14 and is secured thereby to substrate 10. Immersion of the dice in die attach material 14, which at such time is in a softened condition, displaces a portion of the die attach material so as to cause its surface to rise up in the space between dice 16, as shown in FIG. 1. It has been discovered that even with the best die attach material 14, the dice tend to "swim together" during processing steps at high temperatures, since viscosity of die attach material 14 decreases to where it may allow the dice to move slightly. The solution to the "swimming together" problem is to create a grid with the top portion of die attach material 14 so as to hold the dice in place during heating.

Figure 2:
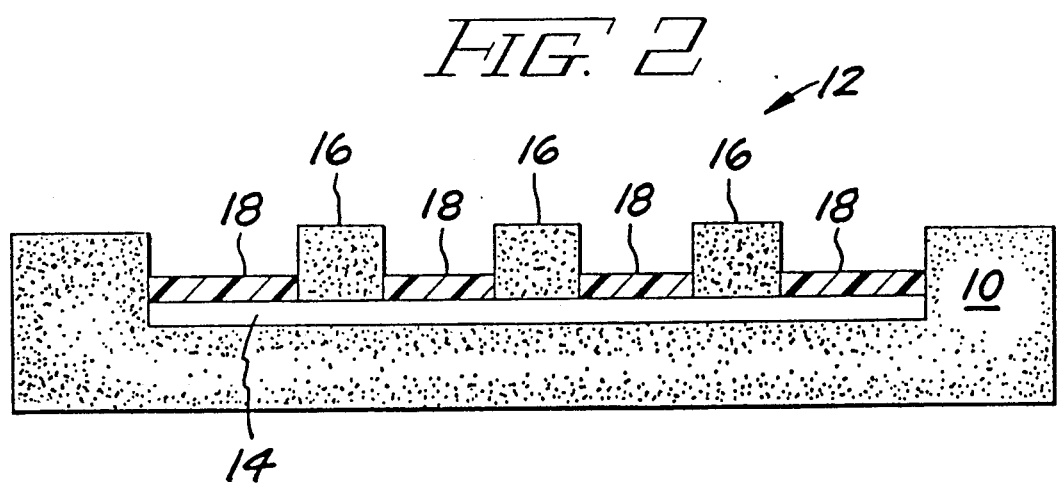
FIG. 2 is a cross-sectional side view of the substrate shown in FIG. 1 after a solvent has been sprayed over the top surface of the chips to form a precipitant, rigid layer from the die attach mixture between the chips.

FIG. 2 shows substrate 10 of FIG. 1 after the top surface of die attach material 14 has been treated such that a solid grid 18 separates the dice. When die attach material 14 comprises either mixture (1) or (2), the grid is created by applying a poor solvent for the die attach material over dice 16 and the exposed top surface of die attach material 14 in cavity 12. Application of the poor solvent may be performed by spraying or dipping. Examples of suitable poor solvents include methanol, acetone, and water. The poor solvent causes Ultem 6000 polyetherimide to precipitate out of solution, thus creating solid grid 18 between dice 16. The thickness of grid 18 is dependent on how long the poor solvent is present on the die attach material. When the grid reaches a sufficient thickness to hold the chips in place, substrate 10 is dried, using the drying cycle outlined above, to yield a substrate 10 having perfectly spaced dice 16. The grid does not readily redissolve or reliquefy until the final drying steps which are performed at 300°C. If die attach material 14 is an epoxy or a polyester, a partial UV cure of the exposed top surface of the die attach material will create a grid 18 suited to withstand processing.

In an improved alternative method for attaching dice to a substrate, hereinafter designated the solvent die-attaching method, the substrate, which may comprise alumina or other suitable material, is coated with a suitable die attach polymer material by spraying, dipping, lamination, spinning or other standard procedure, and the polymer coating is dried. The drying cycle is dependent on the composition of the die attach polymer material and can be varied accordingly. Before the substrate and dice are joined, a solvent for the die attach polymer is applied to the polymer coating by spraying, dotting, stamping or other suitable technique. The solvent enables the polymer coating to wet the dice and thereby bond the dice to the substrate. Capacitors and other miniaturized electronic components can be bonded to a substrate in a similar manner. If mixtures (1) and (2) are utilized for forming the polymer coating, meta-cresol is preferably the solvent that is applied, preferably by spraying onto the polymer coating, to cause the coating to soften and allow the dice to bond to the substrate.

Preferably a 10% weight solution of Ultem 1000 resin or Ultem 6000 polyetherimides, in meta-cresol or other suitable solvent, is sprayed onto the substrate to a thickness of preferably 3 to 5 microns to act as the die attach polymer layer. Meta-cresol (as well as other cresols), NMP, creosote, methylene chloride, tetrahydrafuran (THF), tetra methyl urea, 1, 1, 2 trichloroethane, and other known solvents for Ultem 1000 or Ultem 6000 resins may be used as the spray solvent for this solvent die-attaching method. In pull tests with 240 mil square dice, the bond created by this solvent die-attaching method exhibited greater than 30 pounds shear strength, which is far greater than the 12 pounds side shear minimum required by military specifications. In the tests, all the drying cycles were performed at 100° C., 150° C., and 300° C. for various periods of time, depending on the solvent used. Drying must be performed properly. For example, methylene chloride boils at about 30° C. and this boiling can cause the dice to lift up, resulting in failure to attach to the substrate; therefore, a polymer system using methylene chloride should be dried more slowly at room temperature for a period of time. It will be appreciated that solvents which boil at low temperatures are not as good for the practice of this alternative method for attaching dice to a substrate as the high temperature boiling solvents, such as meta-cresol, NMP, anisole, or blends of these and other solvents. Since solvent dots or spray are applied just prior to placement, use of NMP does not pose the skin over problem discussed earlier. Ultem 1000 resin or Ultem 6000 polyetherimide may be placed on both the die and the substrate to enhance bonding using the solvent die-attaching method. All the dice joined with Ultem 1000 resin or Ultem 6000 polyetherimide applied to both the dice and the substrate exhibited a dried shear test in excess of 35 pounds. In addition, joining of the dice to the substrate is enhanced by utilizing a solvent having a low percentage (0.5% to 5% by weight) of Ultem 1000 resin or Ultem 6000 polyetherimide dissolved therein. These minute amounts of polymer are believed to enhance fusion. Better bottom attachments have been observed on single surface pre-coats, i.e., coating of only the substrate with Ultem 1000 resin or Ultem 6000 polyetherimide, using the latter solvent containing a low percentage of Ultem 1000 resin or Ultem 6000 polyetherimide, and it is presumed similar results will be obtained if both the die and the substrate are coated.

Partially dried Ultem (1000 or 6000) resin, polysulfone and other resins readily redissolves in the presence of a matched solvent for the resin. A semi-dry polymer redissolves more quickly than a totally dried resin. The degree of dryness determines the resolvent time and the type of solvent for the desired attachment characteristics. It has been observed that Ultem 1000 or Ultem 6000 resins that have only been air dried may easily be redissolved by misting at the surface. The resin becomes very sticky and is able to hold dice in place. The results were better than when completely dried polymers were used for die attachment. Judicious selection of the solvents is required and low boiling point solvents such as methylene chloride would not be acceptable for the reasons discussed above.

A very small dot of glue such as epoxy resin or cynoacrylate resin available from Eastman Kodak Company of Rochester, N.Y., can be used to temporarily hold each respective die in place during initial assembly. Dots of epoxy must undergo appropriate time/temperature curing cycles while dots of cynoacrylate adhere on contact. The dice can be simultaneously gang-bonded in place by flooding the substrate with 5% to 10% Ultem 1000 resin or Ultem 6000 polyetherimide solids, by weight, in a solvent mixture, followed by drying completely.

Skybond 700,705 polyimide resin available from the Monsanto Company, of St. Peters, Mo., PYRE-ML polyimide resin available from E. I. du Pont de Nemours and Company, and variants thereof, or other thermosetting polyimides which are applied and merely dried, can be used in a similar manner. The solvent is applied to refresh the surfaces so that they may attach. This treatment is not possible with wet imide materials which skin over in a matter of seconds due to presence of NMP.

The solvent die-attaching method allows utilization of commercial pick and place machines, such as the Mech-el 7002 auto die placer available from Mech-el Industries of Woburn, Mass. A 3 to 5 micron layer of die attach material such as Ultem 1000 resin or Ultem 6000 polyetherimide is applied to a substrate as a film, or alternatively is applied by spraying, dipping, laminating, spinning or other suitable method. The Ultem 1000 resin or Ultem 6000 polyetherimide layer is either partially or fully dried. Drying eliminates the risk of hazardous fumes being inhaled by an operator. Semi-dried or air-dried polymers are easily redissolved by vapors or dots of solvent. The substrates are placed on the walking beam of the pick and place machine and moved to the dispensing head stations thereof which normally dispense epoxy. In this invention, the dispensing heads are used to dot, spray mist, or stamp a solvent that is chosen for its evaporation characteristics with reference to the work time needed to assembly a large die module having in excess of one hundred dice. The substrate is then moved to the die place head where the dice are placed on the substrate and attached. The solvent softens the Ultem 1000 resin or Ultem 6000 polyetherimide layer such that each die adheres to the position at which it is placed by the machine, thus guaranteeing accurate placement. The die itself may also have a layer of Ultem 1000 resin or Ultem 6000 polyetherimide on the side to be attached and, if so, the die is dipped in wet solvent before attachment. A solvent blend including a low percentage of polymeric material can be substituted for the solvent itself. An important feature of the solvent die attachment procedure is the fact that substrates can easily be repaired by simply dissolving the die attach material and removing any die that may be defective and replace it with a new, fully operational die.

While the invention has been described in terms of the preferred embodiments where specific material blends are chosen for die attach materials, specific treatment procedures are used for maintaining the relative positions of the die, and a solvent die-attachment procedure is used for joining a die to a substrate, those skilled in the art will recognize that other die attach mixtures, surface treatments, and die attachment methods can alternatively be utilized without departing from the true spirit of the invention. It is, therefore, to be understood that the appended claims are intended to cover all such modifications and changes as fall within the true spirit and scope of the invention.

What is claimed is:

1. A method of attaching a plurality of dice to a substrate, comprising the steps of:
   coating said substrate with a solution of thermoplastic polymer material to form a polymer solution layer on said substrate;
   immersing said dice in said polymer solution layer so as to displace a portion of said solution of thermoplastic polymer material beneath the dice such that the surface of said solution of thermoplastic polymer material rises up in the space between the dice;
   applying to said thermoplastic polymer material a poor solvent therefor to precipitate polymer material from the solution of thermoplastic polymer material between the dice to form a precipitate grid; and
   drying said polymer solution layer so as to attach said dice to said substrate and form a thicker deposit of polymer material alongside the dice compared to thickness of the thermoplastic polymer material beneath the disc.

2. The method recited in claim 1 wherein said solution of thermoplastic polymer material is a polyetherimide comprised of bisphenol-A-dianhydride and pyromellitic dianhydride condensed with metaphenylene diamine dissolved in a solvent.

3. The method recited in claim 2 wherein said solvent comprises a cresol.

4. The method recited in claim 3 wherein said cresol comprises meta-cresol.

5. The method recited in claim 2 wherein said solvent comprises one of the group consisting of creosote, methylene chloride, tetrahydrafuran, tetra methyl urea, 1,1,2 trichloroethane, n-methyl pyrrolidone and anisole.

6. The method recited in claim 1 wherein said solution of thermoplastic polymer material is a polyetherimide comprised of bisphenol-A-dianhydride condensed with metaphenylene diamine dissolved in a solvent.

7. The method recited in claim 6 wherein said solvent comprises a cresol.

8. The method recited in claim 7 wherein said cresol comprises meta-cresol.

9. The method recited in claim 6 wherein said solvent comprises one of the group consisting of creosote, methylene chloride, tetrahydrafuran, tetra methyl urea, 1,1,2 trichloroethane, n-methyl pyrrolidone, and anisole.

10. The method recited in claim 1 wherein said solution of thermoplastic polymer material comprises a solution of thermoplastic polyimide.

11. The method recited in claim 1 wherein the drying step comprises a predetermined heat and time cycle dependent upon said solution of polymer material.

12. The method recited in claim 1 wherein the drying step comprises a predetermined heat and time cycle dependent upon said polymer solution.

13. The method recited in claim 2 wherein said solvent comprises one of the group consisting of meta-cresol, n-methyl pyrrolidone, anisole, and blends thereof.

14. The method recited in claim 6 wherein said solvent comprises one of the group consisting of meta-cresol, n-methyl pyrrolidone, anisole, and blends thereof.

15. The method of attaching a plurality of dice to a substrate of claim 1 wherein said poor solvent comprises one of the group consisting of methanol, acetone and water.

16. A method of attaching a plurality of dice to a substrate comprising the steps of:
coating said substrate with a solution of polymer material to a thickness in the range of 3 to 5 microns to form a polymer solution layer on said substrate;
immersing said dice in said polymer solution layer so as to displace a portion of said solution of polymer material such that said solution of polymer material rises up in the regions between adjacent dice;
applying to said solution of polymer material a poor solvent therefor to precipitate polymer material from the solution of polymer material in the regions between the dice to form a precipitate grid; and
drying said polymer solution layer so as to attach said dice to said substrate and form a thicker deposit of polymer material alongside the dice compared to thickness of polymer material beneath the dice.

17. The method recited in claim 16 wherein said solution of polymer material is a polyetherimide comprised of bisphenol-A-dianhydride and pyromellitic dianhydride condensed with metaphenylene diamine dissolved in a solvent.

18. The method recited in claim 17 wherein said solvent comprises cresol.

19. The method recited in claim 18 wherein said cresol comprises meta-cresol.

20. The method recited in claim 17 wherein said solvent comprises one of the group consisting of creosote, methylene chloride, tetrahydrafuran, tetra methyl urea, 1,1,2 trichloroethane, n-methyl pyrolidone, and anisole.

21. The method recited in claim 17 wherein said solvent comprises one of the group consisting of meta-cresol, n-methyl pyrrolidone, anisole, and blends thereof.

22. The method recited in claim 16 wherein said dissolved polymer material is a polyetherimide comprised of bisphenol-A-dianhydride condensed with metaphenylene diamine solvented in a solvent.

23. The method recited in claim 22 wherein said solvent comprises a cresol.

24. The method recited in claim 23 wherein said cresol comprises meta-cresol.

25. The method recited in claim 22 wherein said solvent comprises one of the group consisting of creosote, methylene chloride, tetrahydrafuran, tetra methyl urea, 1,1,2 trichloroethane, n-methyl pyrrolidone, and anisole.

26. The method recited in claim 22 wherein said solvent comprises one of the group consisting of meta-cresol, n-methyl pyrrolidone, anisole, and blends thereof.

27. The method recited in claim 16 wherein said solution of polymer material comprises a solution of thermoplastic polyimide.

28. The method recited in claim 16 wherein the drying step comprises a predetermined heat and time cycle dependent upon said polymer solution layer.

29. The method recited in claim 16 wherein the step comprises a predetermined heat and time cycle dependent upon said polymer solution.

30. The method of attaching a plurality of dice to a substrate of claim 16 wherein said poor solvent comprises one of the group consisting of methanol, acetone and water.

* * * * *